US009419188B2

(12) United States Patent
Chang et al.

(10) Patent No.: US 9,419,188 B2
(45) Date of Patent: Aug. 16, 2016

(54) LED LUMINOUS STRUCTURE FOR BACKLIGHT SOURCE

(71) Applicant: UNITY OPTO TECHNOLOGY CO., LTD., New Taipei (TW)

(72) Inventors: Chih-Chao Chang, New Taipei (TW); Hung-Li Yeh, New Taipei (TW); Yu-Ling Tseng, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 0 days.

(21) Appl. No.: 14/619,286

(22) Filed: Feb. 11, 2015

(65) Prior Publication Data

US 2016/0087166 A1  Mar. 24, 2016

(30) Foreign Application Priority Data

Sep. 19, 2014 (TW) .............. 103132440 A

(51) Int. Cl.
| | |
|---|---|
| *H01L 33/50* | (2010.01) |
| *H01L 33/56* | (2010.01) |
| *H01L 27/15* | (2006.01) |
| *H01L 33/62* | (2010.01) |
| *H01L 25/075* | (2006.01) |

(52) U.S. Cl.
CPC .............. *H01L 33/507* (2013.01); *H01L 27/15* (2013.01); *H01L 33/56* (2013.01); *H01L 25/0753* (2013.01); *H01L 33/50* (2013.01)

(58) Field of Classification Search
CPC .... H01L 33/502; H01L 33/52; C09K 11/616; C09K 2211/188
USPC ............... 257/98; 438/34; 252/301.04 F
See application file for complete search history.

(56) References Cited

U.S. PATENT DOCUMENTS

| 2007/0108455 A1* | 5/2007 | Sun et al. .................. 257/89 |
| 2014/0264418 A1* | 9/2014 | Murphy et al. ............. 257/98 |

* cited by examiner

*Primary Examiner* — Evan Pert
*Assistant Examiner* — Changhyun Yi
(74) *Attorney, Agent, or Firm* — Rosenberg, Klein & Lee

(57) ABSTRACT

Disclosed is an LED luminous structure for backlight source with good light emitting efficiency and color light rendering and capable of preventing oxidation or affects overall light quality. The LED luminous structure includes a base, a blue LED chip, a green LED chip, a red phosphor and an encapsulation. The blue and green LED chips are installed on the base, and the red phosphor absorbs is excited by a light emitted from the blue LED chip to produce a red light. The encapsulation is for packaging the aforementioned components. The red phosphor has a particle size of 20-30 μm, and the encapsulation has a moisture permeability of 10-20 $g/m^2.24h$ and an oxygen permeability smaller than 1000 $cm^3/m^2.24h.atm$ to lower the chance of oxidizing the red phosphor and improve the stability, brightness and color gamut of the LED luminous structure by limiting the range of the particle size.

4 Claims, 2 Drawing Sheets

LED LUMINOUS STRUCTURE FOR BACKLIGHT SOURCE

CROSS-REFERENCE TO RELATED APPLICATIONS

This non-provisional application claims priority under 35 U.S.C. §119(a) on Patent Application No(s). 103132440 filed in Taiwan, R.O.C. on Sep. 19, 2014, the entire contents of which are hereby incorporated by reference.

BACKGROUND OF THE INVENTION

1. Field of the Invention

The present invention relates to the field of LED luminous structures, and more particularly to the LED luminous structure for backlight source, which restricts the particle size of phosphor and the feature of encapsulation to achieve the effects of improving the light emitting efficiency and color light yield and preventing the oxidation of the phosphor effectively.

2. Description of the Related Art

Due to the excellent features of semiconductor light emitting components, these components are used extensively as a light source for display and illumination in industries. At present, a light emitting diode (LED) is generally used in the design of the light source for display and illumination, and the design requirement is to improve and provide an illumination effect similar to the daylight effect and different features of light color rendering. Up to now, various high-brightness single chip light emitting diodes have been developed, but present single chip LEDs can emit monochromatic light of a narrowband only due to the band gap of materials. Since the LED can emit a light with a fixed tone, therefore it is necessary to use the color mixing principle of chromatology to show the display and illumination effects of a white light.

At present, a white light source is mainly composed of a plurality of independent LED chips (KGB) that mixes three primary colors or uses the complementary color light mixing effect of a phosphor and the LED chips to show the white light. For example, Nichia Corporation adopts an InGaN series of blue light emitting chips to manufacture yellow phosphor of YAG and excite the yellow phosphor by a blue light to achieve a white light source through the complementation and mixing effects of the color lights. Regardless of the methods used for achieving the white light effect, it is necessary to improve the white light up to a level similar to the actual daylight.

As a backlight source for illumination or display, the color light rendering yield including the color temperature, color rendering coefficient and color gamut/saturation of a light source module must come with a specification to further simulate the true color effect. In addition to the color light rendering, the overall light emitting conditions such as the brightness are also an important element. Most conventional backlight sources of a display adopt a blue LED chip to work together with a yellow phosphor and use the principle of color light complementation to compose a blue light and a yellow light, and thus featuring a low cost and an excellent light emitting efficiency. However, this way of showing a white light includes mixing the blue light and the yellow light with each other, so that the composition of the green light and the red light is too little, and thus causing insufficient color light rendering. Some of the white light source structures use a blue LED chip to operate with a red phosphor and a green phosphor and mixing the three primary color lights to overcome the issue of insufficient light rendering. Regardless of which phosphor is used together with the chip to form the white light source, the properties of the phosphor such as the light absorption strength of the LED chip, the conversion rate of the absorbed light, the stability affected by humidity and heat, the uniformity of particle size will affect the final white light display effect of the light source. As described above, the LED chip operated together with the phosphor is used extensively for white light display or illumination, so that it is an important issue for related manufacturers to utilize the conditions of the phosphor and LED to improve the final effects of the light source including uniformity, color rendering coefficient, color saturation and light emitting efficiency.

In addition to the properties of the phosphor having substantial effects on the color light and the light emitting efficiency, the composition of most present phosphors uses metal ions as an activating agent, and the metal ions are oxidized by moisture easily, so that after the LED light source structure is packaged, it is an important subject to prevent the phosphor from being oxidized easily or affecting the formation of the white light source with the LED chip.

Therefore, the inventor of the present invention designed and developed an LED luminous structure for backlight source that restricts the particle size of the phosphor and the properties of the encapsulation, so that the LED structure provides high light emitting efficiency and wider color gamut, and prevent the activation of phosphor that produces a deviation or finally affects the white light rendering effect caused by oxidation.

SUMMARY OF THE INVENTION

In view of the aforementioned problems of the prior art, it is a primary objective of the present invention to provide an LED luminous structure for backlight source that improves the light emitting efficiency and the color light yield when the LED luminous structure is used as a white light source and maintains the stability of the phosphor to prevent the oxidation or reducing the light emitting effect due to environmental factors.

To achieve the aforementioned objective, the present invention provides an LED luminous structure for backlight source, comprising: a base; a blue LED chip, installed on the base; a green LED chip, installed on the base; a red phosphor, provided for absorbing a blue light emitted by the blue LED chip to produce a red light; and an encapsulation, for packaging the blue LED chip, the green LED chip and the red phosphor, wherein the red phosphor has a chemical formula of $T_2XF_6:Mn^{4+}$, and T is an element selected from the group of Li, Na, K and Rb, and X is an element selected from the group of Ge, Si, Sn, Zr and Ti, and the red phosphor has a particle size falling within a range of 20-30 μm; the encapsulation has a moisture permeability falling within a range of 10-20 $g/m^2 \cdot 24h$ and an oxygen permeability smaller than 1000 $cm^3/m^2 \cdot 24h \cdot atm$, so that the blue LED chip, the green LED chip and the red phosphor are excited by the blue light and mixed with the red light to produce a white light.

Wherein, experiments show that the red phosphor has a preferable particle size of 25 μm to obtain the best light emitting efficiency and color light yield.

To improve the effect of the white light backlight source, the base is preferably a plate structure or a cup structure.

By restricting the particle size of the red phosphor and the properties of the encapsulation, the LED luminous structure for backlight source provides excellent light emitting efficiency, wider color gamut, and long service life of the backlight source and prevents the red phosphor from being moistened or oxidized, and the moistened or oxidized red phosphor may affect the light emitting effect of the white light source.

DETAILED DESCRIPTION OF THE PREFERRED EMBODIMENTS

The aforementioned and other objectives, technical characteristics and advantages of the present invention will become apparent with the detailed description of preferred embodiments and the illustration of related drawings as follows.

Figure 1:
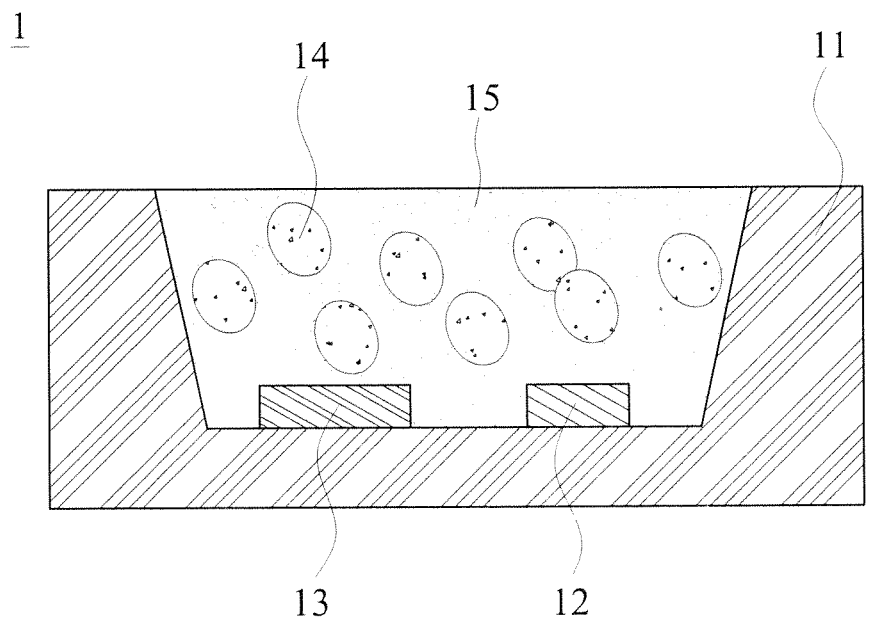
FIG. 1 is a cross-sectional view of a cup structure of the present invention.
Figure 2:
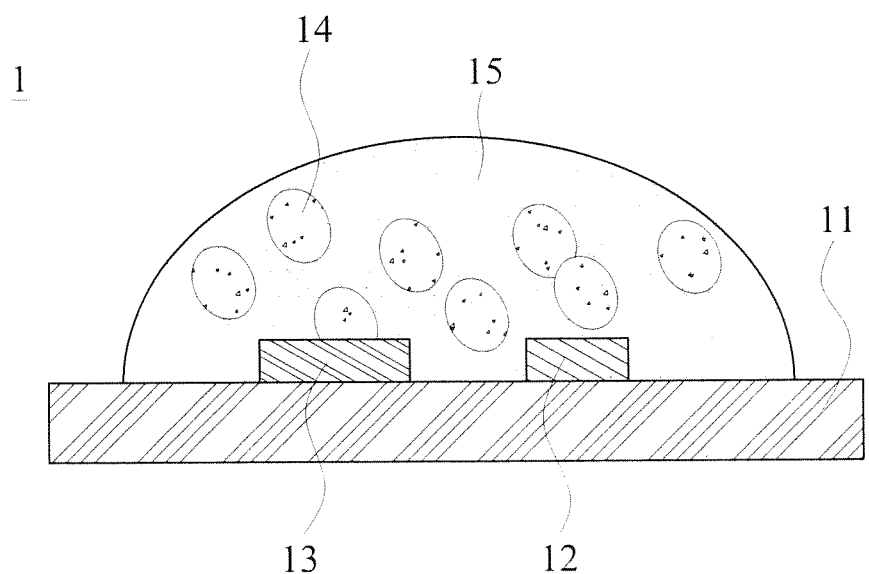
FIG. 2 is a cross-sectional view of substrate having a plate structure of the present invention.

With reference to FIGS. 1 and 2 for the cross-sectional views of a base having a cup structure and a base having a plate structure in accordance with the present invention respectively, an LED luminous structure for backlight source 1 comprises a base 11, a blue LED chip 12, a green LED chip 13, a red phosphor 14 and an encapsulation resin 15.

The blue LED chip 12 and the green LED chip 13 are installed on the base 11, wherein the base 11 may be a plate structure or a cup structure as shown in FIGS. 1 and 2 respectively, and the base 11 is applicable as a white light backlight source regardless of being a plate structure or a cup structure. The red phosphor 14 absorbs the blue light emitted from the blue LED chip 12 and is excited to produce a red light, and then the blue light produced from the blue LED chip 12 is mixed with a green light produced by the green LED chip 13 and the red light to produce a white light. Wherein, the red phosphor 14 has a chemical formula of $T_2XF_6:Mn^{4+}$, wherein T can be any one of Li, Na, K, or Rb, and X can be any one of Ge, Si, Sn, Zr or Ti. In this embodiment, T is K, and X is Si, so that the red phosphor 14 has a chemical formula of $K_2SiF_6:Mn^{4+}$ formed by a chemical co-precipitation method, and a particle size falling within a range of 20 µm-30 µm, and the particle size of the red phosphor 14 is preferably 25 µm, so as to improve the overall light emitting efficiency and light color rendering of the LED luminous structure for backlight source 1. In general, the particle size of the phosphor of the LED light emitting structure will affect the light emitting efficiency, the CIE-Δx value, the CIE-Δy value, and the color light yield after the light is emitted by the chip, so that the particle size of the phosphor has a significant effect on the quality of the light produced after the phosphor is excited by the chip. Wherein, the color light yield is a major factor to be considered in the practical application of the LED luminous structure for backlight source 1. For example, the LED luminous structure is applied in a display device, the backlight source of the LED display is unlike the conventional cold cathode tube having an integrally formed tubular light emitting source; the LED luminous structure comprises a plurality of LED structures connected in series or in parallel to form a backlight lamp strip, so as to form the backlight source structure. When the packaged LED structures produce inconsistent colors or a color deviated from the predetermined one, a display panel with the backlight source produces a color difference or shows non-uniform color. To avoid such situations, related products of the LED backlight source are used to restrict the range and specification of the displayed color. Therefore, the LED luminous structure for backlight source 1 of the invention not only complies with the range and specification of the displayed color only, but also restricts the particle size of the red phosphor 14 to improve the light emitting efficiency and light color yield.

The following table shows the CIE-Δx value, CIE-Δy value, the light emitting efficiency and performance of the color light yield of the mixture of the blue light, the green light, and the red light produced by different particle size (the distribution of particles of the red phosphor 14 is controlled to a range of 1-1.2).

| Range of red phosphor particle size | | CIE-Δx value of blue light + green light + red phosphor | CIE-Δy value of blue light + green light + red phosphor | Light emitting efficiency | Color light yield |
|---|---|---|---|---|---|
| 31-50 µm | 50 µm | 0.055-0.065 | 0.045-0.06 | 95-97% | 80-90% |
| | 45 µm | 0.050-0.060 | 0.045-0.06 | 95-97% | 80-90% |
| | 40 µm | 0.040-0.050 | 0.045-0.06 | 97-99% | 80-90% |
| | 35 µm | 0.040-0.050 | 0.045-0.06 | 97-99% | 80-90% |
| | 31 µm | 0.040-0.050 | 0.045-0.06 | 97-99% | 80-90% |
| 20-30 µm | 30 µm | 0.030-0.040 | 0.03-0.04 | 97-99% | 95-100% |
| | 25 µm | 0.030-0.040 | 0.03-0.04 | 97-100% | 95-100% |
| | 20 µm | 0.030-0.040 | 0.03-0.04 | 97-99% | 95-100% |
| 10-19 µm | 19 µm | 0.025-0.035 | 0.03-0.04 | 94-96% | 95-100% |
| | 15 µm | 0.025-0.035 | 0.03-0.04 | 91-93% | 95-100% |
| | 10 µm | 0.025-0.035 | 0.03-0.04 | 85-87% | 95-100% |

As shown in the table above, the smaller the particle size of the red phosphor 14, the better the color light yield is; however, the light emitting efficiency drops significantly as the particle size decreases. On the other hand, bigger particle size of the red phosphor 14 brings better light emitting efficiency but lower color light yield. When the red phosphor 14 has a particle size of 20-30 µm, both CIE-Δx value and CIE-Δy value of the LED luminous structure for backlight source 1 are 0.03-0.04. In other words, the light color concentration is the best in this case, and the light emitting efficiency and the color light yield are maintained above 97% and 95% respectively. Therefore, the present invention restricts the range of the particle size of the red phosphor 14 to this range in order to achieve the best brightness and light color rendering effect of the LED luminous structure for backlight source 1. It is noteworthy that if the particle size of the red phosphor 14 is 25 µm, the light emitting efficiency will be maintained above 97% or even up to 100%, so that the preferred particle size of the red phosphor 14 is 25 µm.

The encapsulation resin 15 is provided for packaging the blue LED chip 12, the green LED chip 13 and the red phosphor 14, wherein the encapsulation resin 15 has a moisture permeability falling within a range of 10-20 $g/m^2 \cdot 24h$, and an oxygen permeability smaller than 1000 $cm^3/m^2 \cdot 24h \cdot atm$, so that the white light formed by mixing the blue light of the blue LED chip 12, the green light of the green LED chip 13 and the red light of the red phosphor 14 has better light emitting efficiency and color light yield. As described above, the red phosphor 14 has a chemical formula of $T_2XF_6:Mn^{4+}$, so that the red light is produced by the excitation of $Mn^{4+}$. If the $Mn^{4+}$ ions are oxidized, the light emitting efficiency and light color rendering effect of the red phosphor 14 will be affected, so that it is necessary to restrict the moisture permeability and oxygen permeability of the encapsulation resin 15 particularly in order to prevent moisture in the air from permeating into the base 11 and being oxidized with the red phosphor 14, and the permeation and oxidation may affect the display color and the overall white light effect.

The following table shows light emitting rate change (with respect to time) of the LED structures manufactured by the encapsulation resin 15 with different moisture permeability and oxygen permeability conditions. And the testing conditions are as follows: ambient temperature (Ta): 85□; relative humidity (RH): 85%; current: 120 mA; and testing power 0.4 W. Wherein the encapsulation resin of Group A has a moisture permeability greater than 20 g/m².24h and an oxygen permeability greater than 1000 cm³/m².24h.atm; the encapsulation resin of Group B has a moisture permeability of 10-20 g/m².24h and an oxygen permeability greater than 1000 cm³/m².24h.atm; the encapsulation resin of Group C has a moisture permeability of 10-20 g/m².24h and an oxygen permeability smaller than 1000 cm³/m².24h.atm, and the encapsulation resin of Group D has a moisture permeability smaller than 10 g/m².24h and an oxygen permeability smaller than 1000 cm³/m².24h.atm.

| Time (hrs) | Group |  |  |  |
|---|---|---|---|---|
|  | A | B | C | D |
| 1 | 100.00% | 100.00% | 100.00% | 100.00% |
| 144 | 99.69% | 99.92% | 99.99% | 100.00% |
| 312 | 98.16% | 99.09% | 99.79% | 99.90% |
| 480 | 95.87% | 97.83% | 98.95% | 98.45% |
| 624 | 95.11% | 96.69% | 98.11% | 97.73% |
| 1056 | 93.95% | 95.53% | 97.21% | 97.23% |
| 1500 | 92.08% | 94.63% | 96.63% | 96.61% |
| 2000 | 89.26% | 93.54% | 95.74% | 95.36% |
| 2500 | 86.19% | 91.12% | 94.12% | 93.93% |
| 3000 | 85.23% | 89.56% | 92.56% | 92.21% |

Figure 3:
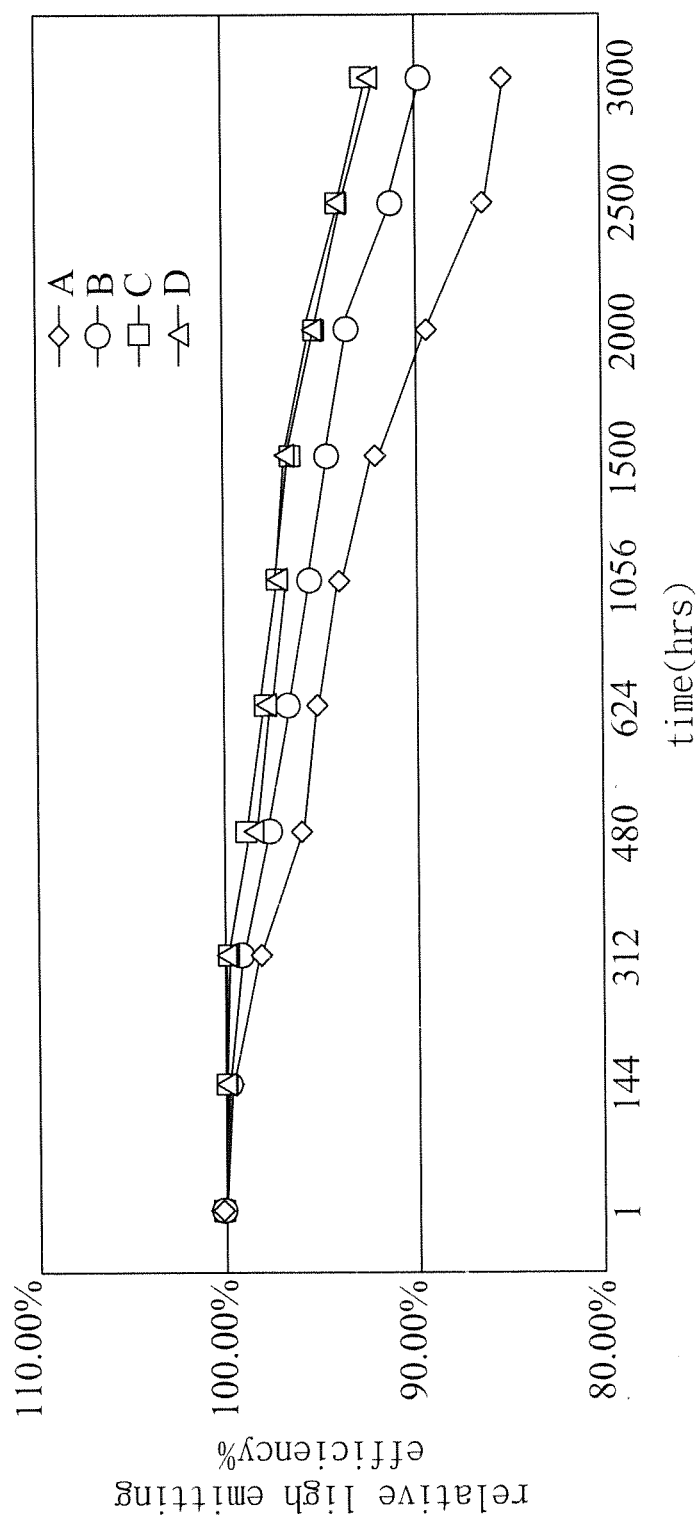
FIG. 3 is a graph of the relative light emitting efficiency of an encapsulation measured at different time under the different moisture permeability and oxygen permeability conditions in accordance with the present invention.

The table above and FIG. 3 show that the encapsulation resin 15 have different light attenuation rates in different conditions; wherein, under the condition which the encapsulation resin 15 has a moisture permeability of 10-20 g/m².24h and oxygen permeability smaller than 1000 cm³/m².24h.atm (Group C in the table), it gives a relative light emitting efficiency better than the encapsulation resin 15 of other groups. In other words, Group C has a slower light attenuation, so that the LED luminous structure for backlight source 1 is able to provide a longer service life. Therefore, the present invention also restricts the moisture permeability and oxygen permeability of the encapsulation resin 15 to maintain the expected light emitting efficiency and service life during the application of the LED backlight source structure 1 and prevents the red phosphor 14 from being oxidized easily. The present invention controls the particle size of the red phosphor 14 and the moisture permeability and oxygen permeability of the encapsulation resin 15 to provide the best light emitting efficiency and light color rendering effect.

As indicated by the experiment data above, the LED luminous structure for backlight source 1 achieves the best light emitting efficiency and color light yield and improves the service life by restricting the particle size of the red phosphor 14 and the moisture permeability and oxygen permeability of the encapsulation resin 15, and also restricts the conditions of the encapsulation resin 15 to prevent the red phosphor 14 from being oxidized by the moisture in the air and avoid any color deviation after the red light is excited by the red phosphor 14. After the blue light of the blue LED chip 12 and the green light of the green LED chip 13 are mixed to show a white light, a specific yield can be maintained.

What is claimed is:

1. An LED luminous structure for backlight source, consisting of:
   a base;
   a blue LED chip, installed on the base;
   a green LED chip, installed on the base;
   a red phosphor, provided for absorbing and to be excited by a blue light emitted by the blue LED chip to produce a red light; and
   an encapsulation resin, for packaging the blue LED chip, the green LED chip and the red phosphor, wherein the red phosphor has a chemical formula of $T_2XF_6:Mn^{4+}$, and T is an element selected from the group of Li, Na, K and Rb, and X is an element selected from the group of Ge, Si, Sn, Zr and Ti, and the red phosphor has a particle size falling within a range of 20-30 μm; the encapsulation resin has a moisture permeability falling within a range of 10-20 g/m².24h and an oxygen permeability smaller than 1000 cm³/m².24h.atm, wherein the particle size of the red phosphor, and the moisture permeability and the oxygen permeability of the encapsulation resin need to be satisfied simultaneously, so that the lights of the blue LED chip, the green LED chip and the red phosphor that is excited by the blue light are mixed together to produce a white light.

2. The LED luminous structure for backlight source as claimed in claim 1, wherein the red phosphor has a preferred particle size of 25 μm.

3. The LED luminous structure for backlight source as claimed in claim 1, wherein the base is a plate structure or a cup structure.

4. The LED luminous structure for backlight source as claimed in claim 2, wherein the base is a plate structure or a cup structure.

* * * * *